(12) United States Patent
Lalor (10) Patent No.: US 10,483,933 B2
(45) Date of Patent: Nov. 19, 2019

(54) AMPLIFICATION ADJUSTMENT IN COMMUNICATION DEVICES

(71) Applicant: Sorenson IP Holdings, LLC, Salt Lake City, UT (US)

(72) Inventor: Christian Lalor, Murray, UT (US)

(73) Assignee: Sorenson IP Holdings, LLC, Salt Lake City, UT (US)

( * ) Notice: Subject to any disclaimer, the term of this patent is extended or adjusted under 35 U.S.C. 154(b) by 34 days.

(21) Appl. No.: 15/474,552

(22) Filed: Mar. 30, 2017

(65) Prior Publication Data

US 2018/0287580 A1 Oct. 4, 2018

(51) Int. Cl.
*G06F 3/16* (2006.01)
*H03G 5/02* (2006.01)
(Continued)

(52) U.S. Cl.
CPC ............. *H03G 5/025* (2013.01); *G06F 3/165* (2013.01); *H04M 5/14* (2013.01); *G06F 3/0481* (2013.01);
(Continued)

(58) Field of Classification Search
CPC ..... H03G 5/025; G06F 3/0481; G06F 3/0488; G06F 3/165; H04M 3/2236; H04M 5/14;
(Continued)

(56) References Cited

U.S. PATENT DOCUMENTS 5,687,104 A * 11/1997 Lane .................. H03G 5/005
708/300
6,724,862 B1 * 4/2004 Shaffer .............. H04M 1/6016
379/347
(Continued)

FOREIGN PATENT DOCUMENTS

EP 1089526 A2 4/2001
EP 2658120 A1 4/2012
(Continued)

OTHER PUBLICATIONS

Boothroyd et al., "Hearing aids: user-adjustment of output and spectrum", Mar. 2016, 15 pages.
(Continued)

*Primary Examiner* — Davetta W Goins
*Assistant Examiner* — Kuassi A Ganmavo
(74) *Attorney, Agent, or Firm* — Maschoff Brennan (57) ABSTRACT

A method to adjust audio amplification may include presenting an audio configuration interface. The audio configuration interface may include multiple amplification settings that each correspond to a different one of multiple frequency range. The multiple amplification settings indicating amplifications may be applied to the multiple frequencies of audio output by a device. The method may further include obtaining an action to adjust the amplification of one or more of multiple amplification settings in the audio configuration interface to generate adjusted amplification settings. The method also includes, in response to obtaining the action, automatically applying the adjusted amplification settings to test audio and automatically outputting the test audio with the applied adjusted amplification settings through a speaker of the device.

17 Claims, 8 Drawing Sheets

(51) Int. Cl.
*H04M 3/22* (2006.01)
*H04M 5/14* (2006.01)
*H04R 3/04* (2006.01)
*G06F 3/0481* (2013.01)
*G06F 3/0488* (2013.01)
*H04M 1/60* (2006.01)
*H04M 1/725* (2006.01)

(52) U.S. Cl.
CPC ......... *G06F 3/0488* (2013.01); *H04M 1/6016* (2013.01); *H04M 1/72563* (2013.01); *H04M 3/2236* (2013.01); *H04R 3/04* (2013.01)

(58) Field of Classification Search
CPC ........... H04M 1/6016; H04M 1/72563; H04M 7/2591; H04R 3/04
See application file for complete search history.

(56) References Cited

U.S. PATENT DOCUMENTS

| | | | |
|---|---|---|---|
| 6,868,162 B1* | 3/2005 | Jubien | H03G 5/22 381/107 |
| 7,664,276 B2* | 2/2010 | McKee Cooper | G01S 11/14 333/28 R |
| 7,877,116 B2* | 1/2011 | Simmons | H04M 1/6016 381/103 |
| 8,010,366 B1 | 8/2011 | Kearby et al. | |
| 2005/0078838 A1* | 4/2005 | Simon | A61B 5/121 381/98 |
| 2006/0045281 A1 | 3/2006 | Korneluk et al. | |
| 2007/0255435 A1* | 11/2007 | Cohen | H04R 1/1016 700/94 |
| 2008/0101589 A1* | 5/2008 | Horowitz | H04M 1/035 379/388.03 |
| 2008/0298600 A1 | 12/2008 | Poe et al. | |
| 2009/0051664 A1* | 2/2009 | Oh | G06F 3/04847 345/173 |
| 2009/0074207 A1* | 3/2009 | Kang | H03G 5/025 381/103 |
| 2010/0029337 A1* | 2/2010 | Kuhl | H04M 1/6016 455/566 |
| 2010/0290654 A1 | 11/2010 | Wiggins et al. | |
| 2011/0157029 A1* | 6/2011 | Tseng | G06F 3/04883 345/173 |
| 2011/0246886 A1* | 10/2011 | Toh | G06F 3/04847 715/716 |
| 2011/0280409 A1* | 11/2011 | Michael | H04R 5/04 381/60 |
| 2013/0102362 A1* | 4/2013 | Inagaki | H03G 9/025 455/563 |
| 2014/0193008 A1 | 7/2014 | Zukic | |
| 2014/0314261 A1 | 10/2014 | Selig et al. | |
| 2015/0016621 A1 | 1/2015 | Wiggins et al. | |
| 2016/0360034 A1 | 12/2016 | Engelke et al. | |

FOREIGN PATENT DOCUMENTS

| | | |
|---|---|---|
| WO | 0008876 A2 | 2/2000 |
| WO | 0124576 A1 | 4/2001 |
| WO | 2005096732 A2 | 10/2005 |
| WO | 2015044926 A1 | 4/2015 |

OTHER PUBLICATIONS

Ultratec, "CrystalTone", website: http://www.ultratec.com/amplified_phones/crystaltone.php, retrieved on Sep. 20, 2016, 2 pages.

* cited by examiner

AMPLIFICATION ADJUSTMENT IN COMMUNICATION DEVICES

FIELD

The embodiments discussed herein are related to amplification adjustment in communication devices.

BACKGROUND

Hearing capabilities of users of communication devices may vary from user to user. Typical communication devices have a fixed frequency response for audio output by the communication device, except for a volume control that equally affects all of the frequencies of the output audio.

The subject matter claimed herein is not limited to embodiments that solve any disadvantages or that operate only in environments such as those described above. Rather, this background is only provided to illustrate one example technology area where some embodiments described herein may be practiced.

SUMMARY

A method to adjust audio amplification may include presenting an audio configuration interface. The audio configuration interface may include multiple amplification settings that each correspond to a different one of multiple frequency ranges. The multiple amplification settings indicating amplifications may be applied to the multiple frequencies of audio output by a device. The method may further include obtaining an action to adjust the amplification of one or more of multiple amplification settings in the audio configuration interface to generate adjusted amplification settings. The method also includes, in response to obtaining the action, automatically applying the adjusted amplification settings to test audio and automatically outputting the test audio with the applied adjusted amplification settings through a speaker of the device.

BRIEF DESCRIPTION OF THE DRAWINGS

Example embodiments will be described and explained with additional specificity and detail through the use of the accompanying drawings in which.

DESCRIPTION OF EMBODIMENTS

Individuals with hearing impairments, caused by age or other factors, may struggle to understand a conversation with another person. In particular, hearing impaired individuals may struggle to understand conversations taking place over a phone or video chat.

Some embodiments of the present disclosure provide a communication device that includes an audio configuration interface. The audio configuration interface may allow a hearing-impaired user of the communication device to adjust amplification settings for amplifications applied to various frequencies of audio output by the communication device. The ability to adjust the amplification settings may assist the hearing-impaired user to understand a conversation occurring through the communication device. In some embodiments, the present disclosure allows a user to better customize the amplification settings through the audio configuration interface. For example, in the present disclosure, after a change in the audio configuration interface to an amplification setting, the communication device may automatically output test audio, which includes human voices, with the changes in the amplification settings being applied to the test audio. As a result, a user may receive real-time feedback of a change in the audio configuration interface to allow the user to determine if the change helped to enhance the user's understanding of audio output by the communication device.

Figure 1A:
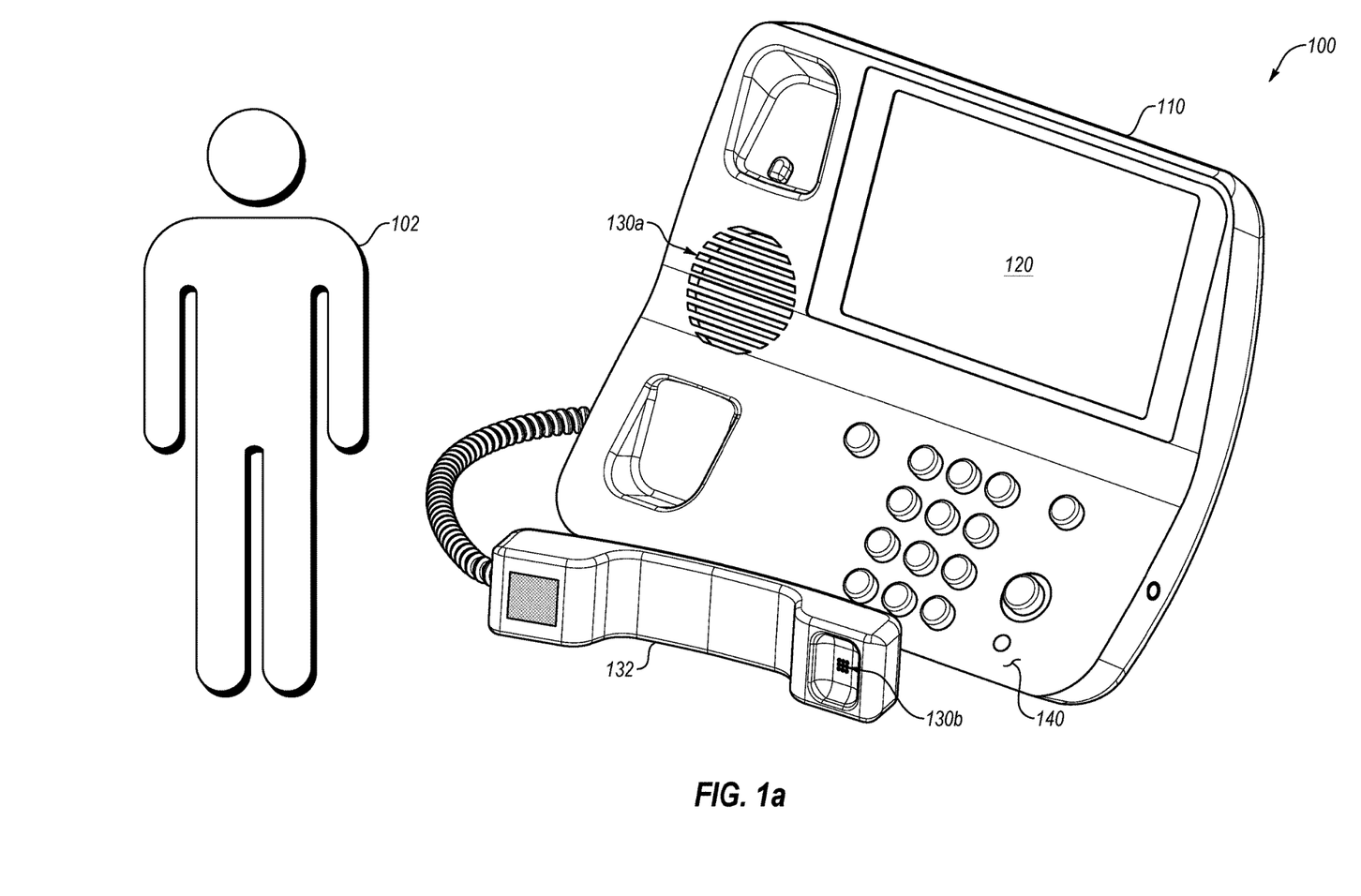
FIG. 1a illustrates an example environment related to adjusting amplification of audio output by a communication device.

Turning to the figures, FIG. 1a illustrates an example environment 100 related to adjusting amplification of audio output by a communication device. The environment 100 may be arranged in accordance with at least one embodiment described in the present disclosure.

The environment 100 includes a user 102 and a communication device 110. The communication device 110 may be any analog or digital device configured to enable voice calls, video calls, or other communication sessions, over an analog or digital interface. As illustrated, the communication device 110 includes a communication console. In other embodiments, the communication device 110 may include a telephonic device, a cellular phone, a smartphone, a laptop computer, a tablet computer, or other communication device configured to output audio for presentation to a user. In some embodiments, the communication device 110 may be configured to establish and maintain communication sessions with one or more other communication devices. The communication sessions may be established over any combination of networks, including plain old telephone service (POTS) networks, data networks using Voice over Internet Protocol (VoIP) or other protocols, or cellular networks, among other types of communication networks.

Figure 1B:
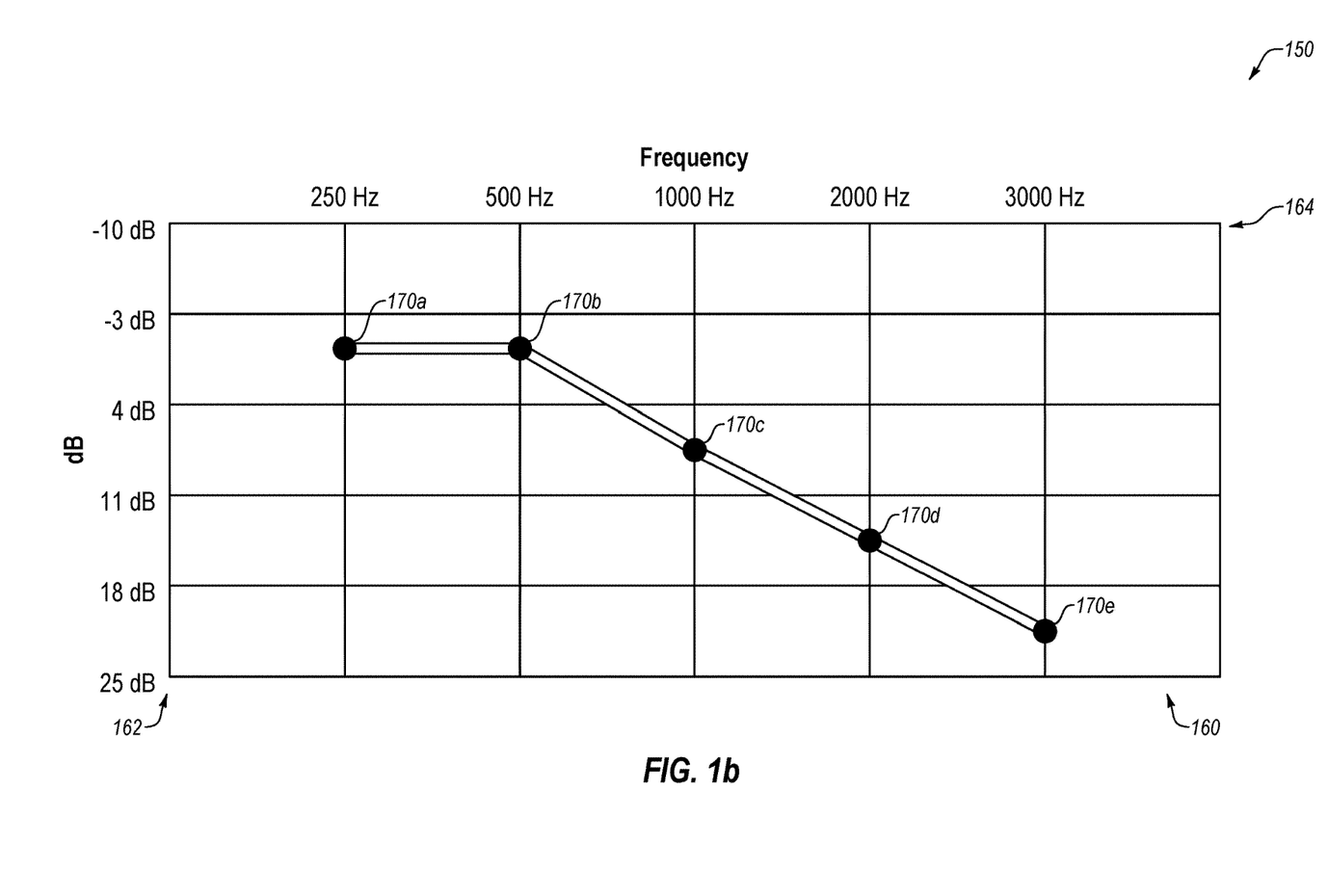
FIG. 1b illustrates an example audio configuration interface.

The communication device 110 may include a display 120, a first speaker 130a, a second speaker 130b, referred to collectively as the speakers 130, a handset 132, and a user interface 140. Using the display 120, the communication device 110 may be configured to present an audio configuration interface to the user 102. An example of an audio configuration interface is illustrated in FIG. 1b, and discussed more fully later in the present disclosure. The first speaker 130a and the second speaker 130b may be configured to broadcast audio. The user interface 140 may be configured to receive user input. For example, the user interface 140 may receive input from the user 102 with respect to the audio configuration interface.

In some embodiments, the communication device 110 may be configured to adjust an amount of amplification applied to one or more frequencies or frequency ranges of audio output by the communication device 110. In some embodiments, the communication device 110 may adjust the amount of amplification applied to one or more frequencies or frequency ranges of audio output by the communication device 110 based on user input through the audio configuration interface. In these and other embodiments, the communication device 110 may thus be configured to allow a user to adjust a frequency response of the communication device 110 based on the hearing capability of the user. As a result, the communication device 110 may be configured to compensate for hearing loss of the user.

For example, the communication device 110 may be configured to apply different amplifications to two, three, four, five, eight, ten, fifteen, or more frequencies or frequency ranges of audio within a hearing spectrum of a human. In these and other embodiments, each of the frequency ranges may include the same number of frequencies. Alternatively or additionally, each of the frequency ranges may include a different number of frequencies or some frequency ranges may include the same number of frequencies and others may include a different number of frequencies. In some embodiments, amplification of some frequencies or frequency ranges may result in the amplification of other frequencies or frequency ranges. Alternatively or additionally, each of the frequencies or frequency ranges may be individually adjusted.

Adjusting the amplification of a frequency or frequency range may include increasing the amplification of the frequency or frequency range or decreasing the amplification of the frequency or frequency range. In these and other embodiments, increasing or decreasing the amplification of a frequency or frequency range may include decreasing or increasing the amplification of the frequency or frequency range with respect to a baseline amplification that is applied to some or all of the frequencies or frequency ranges. In some embodiments, the amplification may be a voltage amplification that adjusts a magnitude of an audio signal. In these and other embodiments, an increase in amplification may increase the magnitude which may increase how loud a frequency sounds. Alternatively or additionally, a decrease in amplification may decrease the magnitude which may decrease how loud a frequency sounds.

Alternatively or additionally, increasing or decreasing the amplification of a frequency or frequency range may include increasing or decreasing the amplification applied to other frequencies or frequency ranges from the baseline without adjusting the amplification of the frequency or frequency range. For example, first and second frequencies may be amplified with a baseline amplification of 10 dB. An adjustment to increase the amplification of the first frequency may result in the magnitude of the second frequency being decreased from 10 dB while the first frequency is maintained at 10 dB. As a result, the first frequency may sound louder than the second frequency when output even though the first frequency was not adjusted.

In some embodiments, the communication device 110 may be configured to allow the user 102, to adjust each of the frequencies or frequency ranges. Alternatively or additionally, the communication device 110 may allow the user to adjust one or more of the frequencies or frequency ranges and may adjust other of the frequencies or frequency ranges based on adjustments made by the user. In some embodiments, the communication device 110 may present the amplifications applied to different frequencies or frequency ranges through an audio configuration interface on the display 120. In these and other embodiments, the communication device 110 may receive input from a user, such as the user 102, through the user interface 140 to adjust the amplifications of one or more of the different frequencies or frequency ranges.

FIG. 1b illustrates an example audio configuration interface 150 that may be presented to a user by the display 120. The audio configuration interface 150 includes a diagram 160, that includes a y-axis 162, an x-axis 164, a first adjuster 170a, a second adjuster 170b, a third adjuster 170c, a fourth adjuster 170d, and a fifth adjuster 170e, collectively referred to as adjusters 170.

The x-axis 164 may represent frequency in Hertz. The y-axis 162 may represent amplification in decibels over the baseline amplification. The first adjuster 170a may represent an amplification applied to a 250 Hertz frequency signal. The second adjuster 170b may represent an amplification applied to a 500 Hertz frequency signal. The third adjuster 170c may represent an amplification applied to a 1000 Hertz frequency signal. The fourth adjuster 170d may represent an amplification applied to a 2000 Hertz frequency signal. The fifth adjuster 170e may represent an amplification applied to a 3000 Hertz frequency signal.

Each of the adjusters 170 may be individually adjusted to change the amplifications applied to the frequencies associated with the adjusters. For example, a user may select the first adjuster 170a and move the first adjuster 170a along the y-axis 162 to adjust an amount of amplification applied by the communication device 110 to audio output by the communication device 110 at 250 Hertz. The amplification illustrated in the y-axis 162 may be an amplification applied to the audio above a baseline amplification. Thus, as illustrated, less than the baseline amplification may be applied if an adjuster 170 is moved to the negative amplification.

Returning to a discussion of FIG. 1a, in response to an adjustment made by the user 102 to an amplification setting for a frequency or frequency range in the audio configuration interface, the communication device 110 may be configured to automatically output test audio with the adjusted amplification setting applied to the test audio. The output test audio with the adjusted amplification settings may allow the user 102 to aurally assess the amplification adjustment. The aural assessment of the amplification adjustment may allow the user 102 to continue to refine the amplification settings to achieve amplification settings that are better for the user 102.

In some embodiments, initial amplification settings may be randomly selected. Additionally or alternatively, the initial amplification settings may be based on what other users have selected. In these and other embodiments, the aural assessment allows the user 102 to refine the amplification settings for their particular hearing loss.

Alternatively or additionally, initial amplification settings may be applied based on a hearing test or other information. However, given how a frequency response of the communication device 110 may change based on manufacturing variations, temperature, humidity, surrounding objects, and other factors, as well as how the audio from conversations over a network may have different attenuations or amplifications based on the network, the aural assessment allows the user 102 to refine the amplification settings to account for some or all of these factors.

The test audio may include multiple different types of audio. In some embodiments, the test audio may be a sound of the frequency or frequency range with the adjusted amplification setting. Alternatively or additionally, the test audio may be music, random sounds, or speech. In some embodiments, the test audio may be selected based on input from the user 102.

In some embodiments, when the test audio is speech, the speech may include male, female, or both male and female voices. In these and other embodiments, by including both male and female voices, the user 102 may gain a better understanding of how the adjustment to the amplification setting may affect an ability of the user 102 to understand both male and female participants in a conversation using the communication device 110.

In some embodiments, the test audio may be output by the communication device 110 for a duration adequate to allow the user 102 to aurally assess the amplification settings. In these and other embodiments, the duration for outputting the test audio may vary based on the user. In some embodiments, the duration may be three, five, ten, fifteen, twenty, thirty, forty, fifty, or sixty seconds, among other durations of time. In some embodiments, the duration of time may vary based on the type of the test audio. For example, test audio of homogeneous sounds, such as a single frequency, may be shorter than complex sounds, such as speech or music, because the one or more frequencies adjusted for complex sounds may occur only intermittently in the complex sounds.

In some embodiments, the test audio with the applied amplification settings may be automatically output before other audio configured to allow a user to aurally assess the adjusted amplification settings is output by the communication device 110. In these and other embodiments, no other audio configured to allow a user of the communication device to aurally assess the amplification settings is output by the communication device after the adjustment made by the user 102 and before outputting the test audio with the applied adjusted amplification settings. Audio that may be configured to allow a user to aurally assess the adjusted amplification settings may include audio at the frequency that has had the adjusted amplification settings applied. In these and other embodiments, other audio, for example a beep, alarm, or other sound may be output by the communication device 110 to indicate that the adjustment to the amplification settings is accepted where the other audio is not of the frequency adjusted and/or has an amplification that is not affected by the adjustment to the amplification settings.

In some embodiments, the test audio with the applied amplification settings may be automatically output after the communication device 110 determines that the user 102 has stopped interacting with the audio configuration interface. In some embodiments, it may be determined that the user 102 has stopped interacting with the audio configuration interface based on a particular period of time lapsing from the last user input received by the user interface 140. Alternatively or additionally, it may be determined that the user 102 has stopped interacting with the audio configuration interface based on the user interface 140 not receiving additional user interactions to further adjust amplification settings. In these and other embodiments, the user interface 140 may still be receiving input from the user, but the input may not be related to adjusting the amplification settings for individual frequencies or frequency ranges. For example, the user interface 140 may be receiving user input to adjust a volume of the communication device 110 or some other setting of the communication device 110.

In some embodiments, determining whether the user 102 has stopped interacting with the audio configuration interface may be based on the type of the user interface 140. For example, the user interface 140 illustrated in FIG. 1*a* includes buttons. It may be determined that the user 102 has stopped interacting with the audio configuration interface when no input is received from the buttons that may result in adjustments in the audio configuration interface. Alternatively or additionally, the user interface 140 may be a touch screen. In these and other embodiments, it may be determined that the user 102 has stopped interacting with the audio configuration interface when input is no longer received. For example, when a finger or other object that interfaces with the touch screen stops touching the screen after adjusting the amplification settings.

In some embodiments, after the test audio has been output, additional adjustment to an amplification setting for a frequency or frequency range in the audio configuration interface may be obtained. In these and other embodiments, for each of the adjustments, the test audio or a different test audio may be output by the communication device 110.

In some embodiments, additional adjustment to an amplification setting for a frequency or frequency range in the audio configuration interface may be obtained while the test audio from a previous adjustment is being output by the test audio. In some embodiments, in response to the additional adjustments the test audio being currently output may be stopped and other or the same test audio with the previous and additional adjustments to the amplification settings being applied may be output. Alternatively or additionally, in response to the additional adjustments, the additional adjustments may be applied to the test audio currently being output such that the additional adjustments and the previous adjustments are both applied to the test audio while the test audio is being output and without stopping the test audio.

Alternatively or additionally, in response to the additional adjustments, the additional adjustments may be applied to the test audio currently being output and the previous adjustments may not be applied such that only the additional adjustments are applied to the test audio. For example, in response to an adjustment to change the amplification of 500 Hz from 5 dB to 15 dB, test audio may be output with the adjustment applied. While the test audio is being output, an additional adjustment may be obtained to adjust the amplification of 1000 Hz from 15 dB to 10 dB. In this example, the amplification settings may be adjusted such that the amplification of 500 Hz is changed from 15 dB to 5 dB to un-apply the previous adjustment and the amplification of 1000 Hz is changed from 15 dB to 10 dB to apply the current adjustment.

In some embodiments, each of the speakers 130 may have individual amplification settings. The speakers 130 may have individual amplification settings because each of the speakers 130 may have a different frequency response. As a result of the different frequency responses, each of the speakers 130 may output sound differently. To accommodate the different frequency responses, each of the speakers 130 may be adjusted individually.

In these and other embodiments, when the amplification settings of one of the speakers 130 has been adjusted but the other of the speakers 130 has not been adjusted, the unadjusted speaker may use the adjustments for the other of the speakers 130.

In some embodiments, the example environment 100 may determine to which speaker the adjustments apply based on a selection received from the user 102. Alternatively or additionally, the communication device 110 may automatically determine to which speaker the adjustments apply based on which of the speakers are being used. For example, when the handset 132 is in an off-hook condition, for example as illustrated, the second speaker 130*b* may be the speaker being used. In these and other embodiments, amplification adjustments may be applied to the one of the speakers 130 that is being used. Thus, when the handset 132 is in an off-hook condition, the second speaker 130*b* may be the speaker 130 being used and the amplification adjustments made when the second speaker 130*b* is being used may be saved and associated with the second speaker 130*b*.

Alternatively or additionally, when the handset 132 is in an on-hook condition, the first speaker 130a may be the speaker 130 being used and the amplification adjustments made when the first speaker 130a is being used may be saved and associated with the first speaker 130a.

In these and other embodiments, the communication device 110 may change which amplification settings to apply to audio based on which of the speakers is being used. For example, if the user 102 begins a conversation using the first speaker 130a, first amplification settings associated with the first speaker 130a may be used for the audio. During the conversation, the user 102 may take the handset 132 of the communication device 110 causing the second speaker 130b to be used. In these and other embodiments, second amplification settings associated with the second speaker 130b may be used.

Modifications, additions, or omissions may be made to the environment 100 without departing from the scope of the present disclosure. For example, in some embodiments, the communication device 110 may not be a device configured for communication. For example, the communication device 110 may be configured to output audio, such as an audio player. As another example, the communication device 110 may not include the user interface 140 as illustrated. In these and other embodiments, the user interface 140 and the display 120 may be combined.

Figure 2:
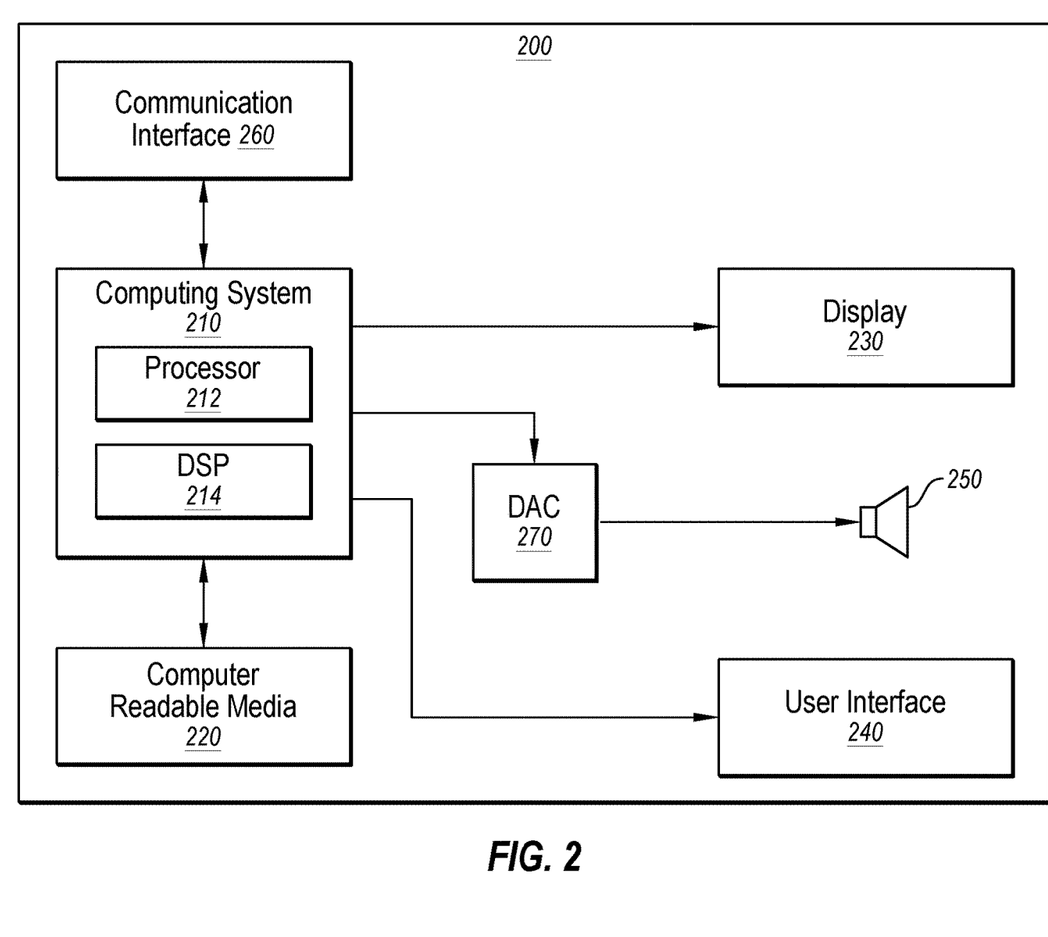
FIG. 2 illustrates an example communication device configured to adjust amplification of output audio.

FIG. 2 illustrates an example device 200 configured to adjust amplification of output audio. The device 200 may be arranged in accordance with at least one embodiment described in the present disclosure. The device 200 may be a communication device, in some embodiments. The device 200 may include a computing system 210, which may include a processor 212 and a digital signal processor (DSP) 214, a computer readable media 220, a display 230, a user interface 240, a speaker 250, a communication interface 260, and a digital-to-analog converter (DAC) 270. In some embodiments, the device 200 may be an example of the communication device 110 of FIG. 1.

Generally, the processor 212 may include any suitable special-purpose or general-purpose computer, computing entity, or processing device including various computer hardware or software modules and may be configured to execute instructions stored on any applicable computer-readable storage media. For example, the processor 212 may include a microprocessor, a microcontroller, an application-specific integrated circuit (ASIC), a Field-Programmable Gate Array (FPGA), or any other digital or analog circuitry configured to interpret and/or to execute program instructions and/or to process data.

Although illustrated as a single processor in FIG. 2, it is understood that the processor 212 may include a multi-core processor or any number of processors distributed across any number of networks or physical locations that are configured to perform individually or collectively any number of operations described herein. In some embodiments, the processor 212 may interpret and/or execute program instructions and/or process data stored in the computer readable media 220.

The DSP 214 may be configured to adjust amplifications applied to test audio output by the example device 200. For example, the DSP 214 may receive test audio and amplification settings. The DSP 214 may apply the amplification settings to the test audio and output the test audio with the applied amplification settings. In some embodiments, the DSP 214 may apply the test audio to the DAC 270.

The computer readable media 220 may include one or more types of computer-readable storage media or one or more computer-readable storage mediums for carrying or having computer-executable instructions or data structures stored thereon. Such computer-readable storage media may be any available media that may be accessed by a general-purpose or special-purpose computer, such as the processor 212. By way of example, and not limitation, such computer-readable storage media may include non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a general-purpose or special-purpose computer. Combinations of the above may also be included within the scope of computer-readable storage media. In these and other embodiments, the term "non-transitory" as used herein should be construed to exclude only those types of transitory media that were found to fall outside the scope of patentable subject matter in the Federal Circuit decision of In re Nuijten, 500 F.3d 1346 (Fed. Cir. 2007). In some embodiments, computer-executable instructions may include, for example, instructions and data configured to cause the processor 212 to perform or cause performance of a certain operation or group of operations, such as one or more blocks of the methods 300, 400, and/or 500. The computer readable media 220 may further include the test audio and amplification settings.

The display 230 may be configured as one or more electronic displays, like an LCD, LED, or other type display. The display 230 may be configured to the audio configuration interface, present video, text captions, and other data as directed by the processor 212.

The user interface 240 may include any device to allow a user to interface with the device 200. For example, the user interface 240 may include a mouse, a track pad, a keyboard, various button, and/or a touchscreen, among other devices. The user interface 240 may receive input from a user and provide the input to the processor 212.

The DAC 270 may be any type of device configured to convert digital data stream to an analog audio signal. In these and other embodiments, the DAC may thus have sufficient resolution to output audio signals to allow for a human to understand voices in the audio signals. The speaker 250 may be any type of speaker configured to convert an analog audio signal to sound waves.

The communication interface 260 may include any component, device, system, or combination thereof that is configured to transmit or receive information over a network. In some embodiments, the communication interface 260 may communicate with other devices at other locations, the same location, or even other components within the same system. For example, the communication interface 260 may include a modem, a network card (wireless or wired), an infrared communication device, a wireless communication device (such as an antenna), and/or chipset (such as a Bluetooth device, an 802.6 device (e.g., Metropolitan Area Network (MAN)), a WiFi device, a WiMax device, cellular communication facilities, etc.), plain old telephone service (POTS), and/or the like. The communication interface 260 may permit data to be exchanged with a network and/or any other devices or systems described in the present disclosure.

An example of the operation of device 200 follows. The processor 212 may access the computer readable media 220 to obtain instructions to display an audio configuration interface. The processor 212 may provide instructions to the display 230 regarding the display of the audio configuration interface. The display 230 may display the audio configuration interface. A user may interact with the user interface 240 and provide an input to the user interface 240 that corresponds to an adjustment of the amplification of a frequency as displayed in the audio configuration interface. The input from the user may be provided to the computing system 210. The input may be used by the DSP 214 to adjust the amplification settings to be applied to audio.

In response to the input from the user, test audio may be provided to the DSP 214 from the computer readable media 220. The DSP 214 may apply the adjusted amplification settings to the test audio. After having the adjusted amplification settings applied, the test audio may be provided to the DAC 270. The DAC 270 may convert the digital test audio to an analog signal that is provided to the speaker 250. The speaker 250 may broadcast soundwaves representative of the analog signal provided to the speaker 250 of the test audio. The user may listen to the test audio to aurally assess the adjustments to the amplification settings.

Modifications, additions, or omissions may be made to the device 200 without departing from the scope of the present disclosure. For example, in some embodiments, the example device 200 may not include the DSP 214. In these and other embodiments, the processor 212 or other device in the computing system 210 may apply the amplifications to the test audio. As another example, in some embodiments, the example device 200 may not include the communication interface 260.

Figure 3A:
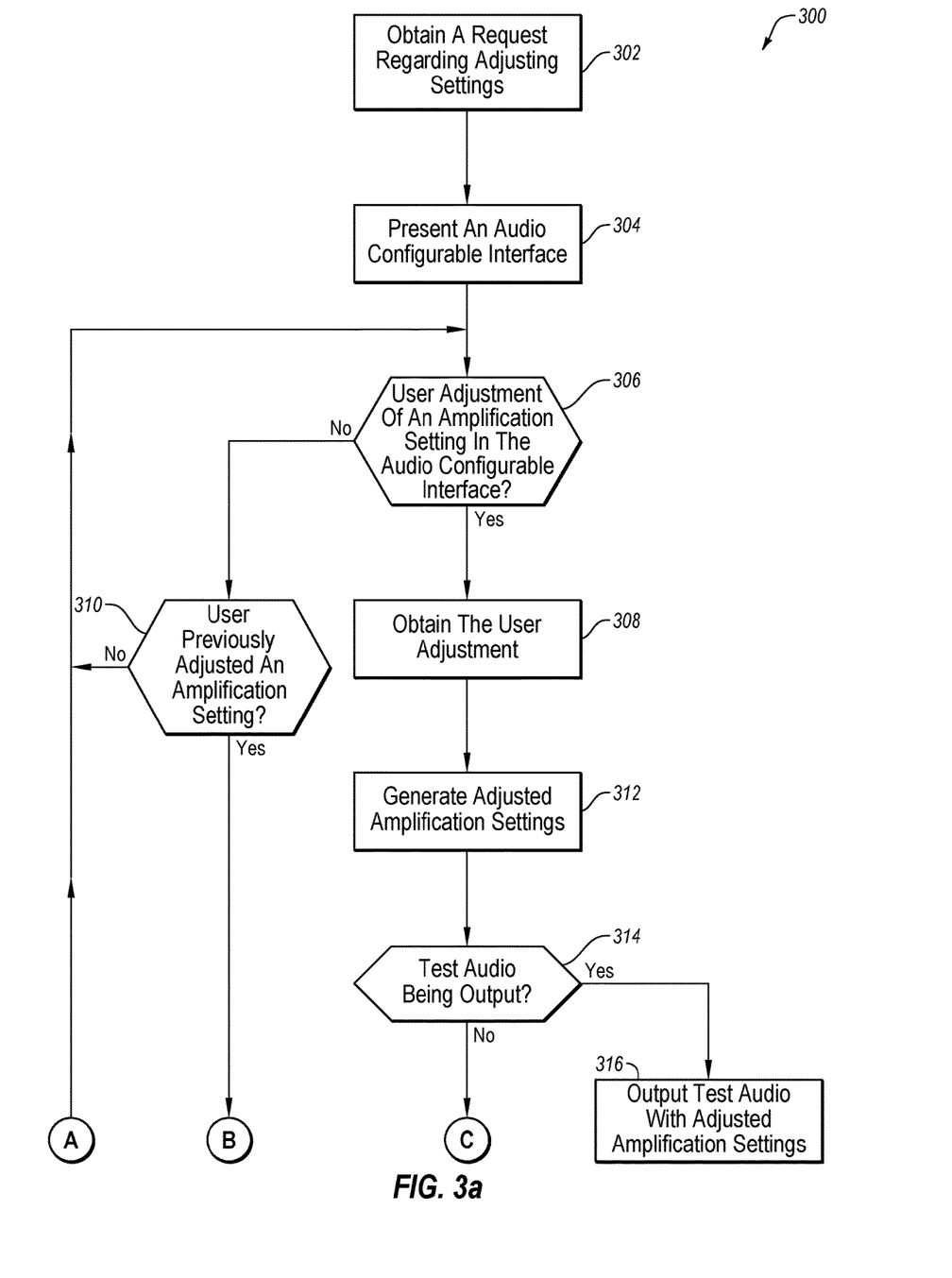
FIGS. 3A and 3B include a flowchart of an example method to adjust amplification of output audio.
Figure 3B:
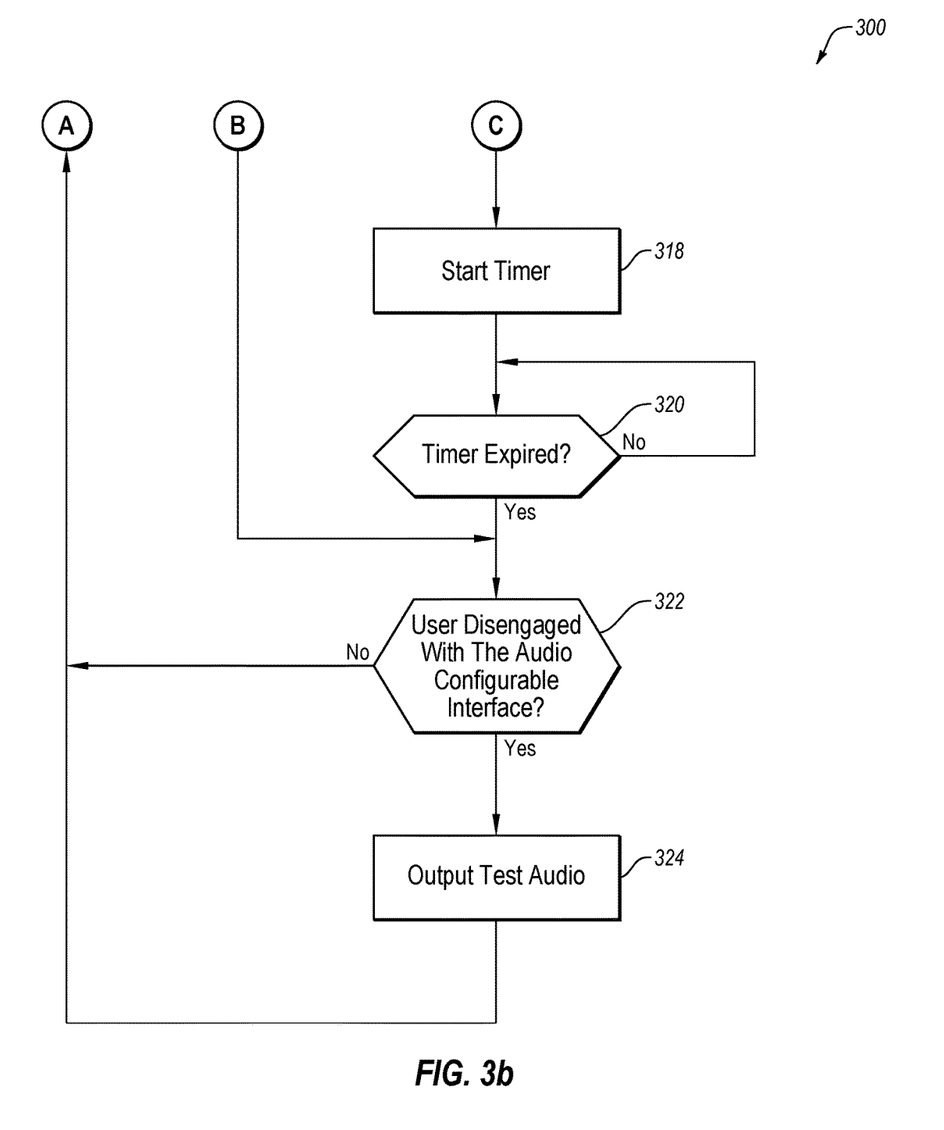

FIGS. 3A and 3B include a flowchart of an example method 300 to adjust amplification of output audio. The method 300 may be arranged in accordance with at least one embodiment described in the present disclosure. The method 300 may be performed, in whole or in part, in some embodiments by a device, such as the communication device 110, the device 200, and/or the communication system 600 of FIGS. 1a, 2, and 6, respectively. In these and other embodiments, some or all of the operations of the method 300 may be performed based on the execution of instructions stored on one or more non-transitory computer-readable media. Although illustrated as discrete blocks, various blocks may be divided into additional blocks, combined into fewer blocks, or eliminated, depending on the desired implementation.

The method 300 may begin at block 302, where a request regarding adjusting settings may be obtained. The request may be obtained based on a user input received by a device. The user input may include a selection of a button or graphic user interface element.

In block 304, an audio configuration interface may be presented. In some embodiments, the audio configuration interface may be presented in response to the request. The audio configuration interface may be presented by a display. An example of the audio configuration interface may be the audio configuration interface 150 illustrated in FIG. 1b.

In block 306, it may be determined if there is a user adjustment of an amplification setting in the audio configuration interface. In response to a user adjustment of the amplification settings, the method 300 may proceed to block 308. In response to no user adjustment of the amplification settings, the method 300 may proceed to block 310.

In block 308, the user adjustment may be obtained.

In block 310, it may be determined if the user previously adjusted an amplification setting. In response to the user previously adjusting an amplification setting, the method 300 may proceed to block 322. In response to the user not previously adjusting an amplification setting, the method 300 may proceed to block 306.

In block 312, adjusted amplification settings may be generated. The adjusted amplification settings may be generated based on the user adjustment.

In block 314, it may be determined if test audio is being output. In response to test audio being output, the method 300 may proceed to block 316. In response to test audio not being output, the method 300 may proceed to block 318.

In block 316, test audio may be output with the adjusted amplification settings.

In block 318, a timer may be started. The timer may be associated with a configurable delay between receiving the user input and outputting audio. The configurable delay may be based on an average time that a user may interact with the audio configuration interface. For example, an average time that a user may adjust settings in the audio configuration interface.

In block 320, it may be determined if the timer has expired. In response to the expiration of the timer, the method 300 may be proceed to block 322. In response to the timer not expiring, the method 300 may remain at block 320.

In block 322, it may be determined if the user has disengaged with the audio configuration interface. In response to the user disengaging with the audio configuration interface, the method 300 may proceed to block 324. In response to the user not disengaging with the audio configuration interface, the method may proceed to block 306.

In block 324, test audio may be output.

One skilled in the art will appreciate that, for these processes, operations, and methods, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments.

For example, in some embodiments, the method 300 may not include the blocks 318 and 320. In these and other embodiments, the test audio may be output after the user disengages with the user interface. As another example, the method 300 may not include the blocks 310 and 322. In these and other embodiments, the method 300 may output the test audio after the timer expires regardless of whether the user is engaged or the user has disengaged with the user interface. As another example, the method 300 may not include blocks 310, 318, 320, 322. In these and other embodiments, the method 300 may output the test audio after the amplification settings are adjusted based on the user input.

Figure 4:
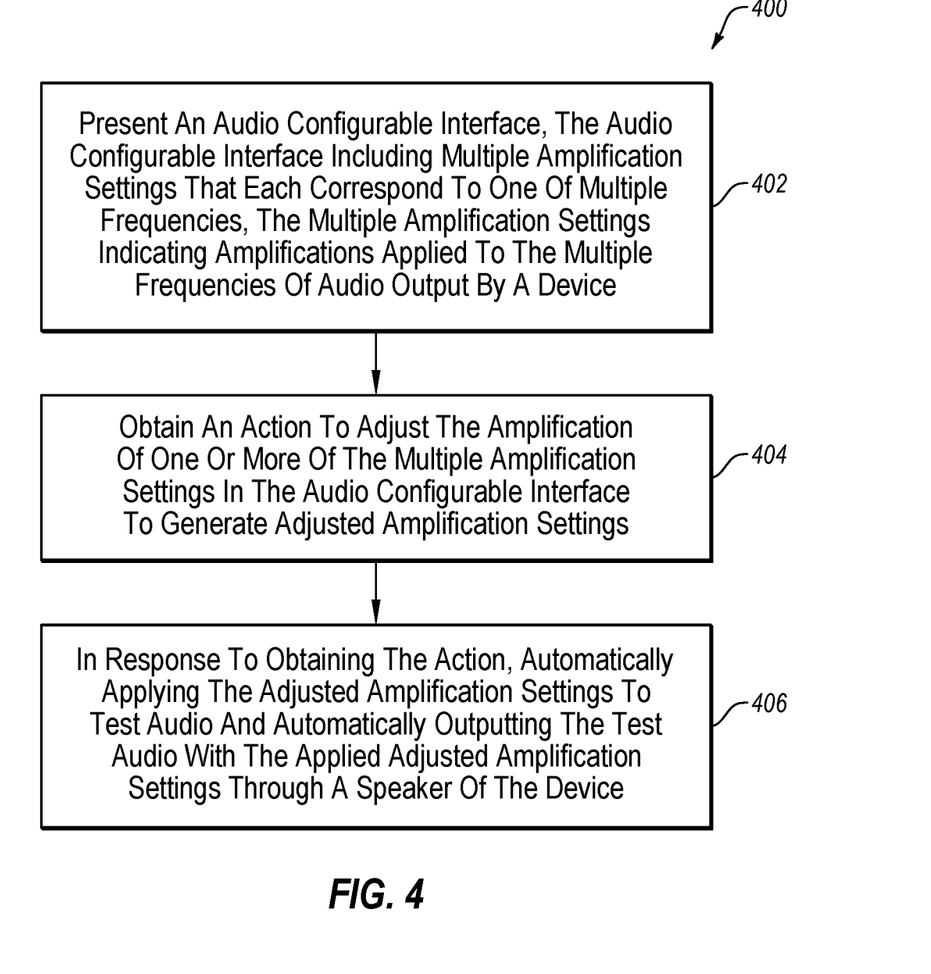
FIG. 4 is a flowchart of another example method to adjust audio amplification.

FIG. 4 is a flowchart of another example method 400 to adjust audio amplification. The method 400 may be arranged in accordance with at least one embodiment described in the present disclosure. The method 400 may be performed, in whole or in part, in some embodiments by a device, such as the communication device 110, the device 200, and/or the communication system 600 of FIGS. 1a, 2, and 6, respectively. In these and other embodiments, some or all of the steps of the method 400 may be performed based on the execution of instructions stored on one or more non-transitory computer-readable media. Although illustrated as discrete blocks, various blocks may be divided into additional blocks, combined into fewer blocks, or eliminated, depending on the desired implementation.

The method 400 may begin at block 402, where an audio configuration interface may be presented. The audio configuration interface may include multiple amplification settings that each correspond to a different one of multiple frequencies. The multiple amplification settings may indicate amplifications applied to the multiple frequencies of audio output by a device.

In block 404, an action to adjust the amplification of one or more of the multiple amplification settings in the audio configuration interface may be obtained. The action may be used to generate adjusted amplification settings.

In block 406, in response to obtaining the action, the adjusted amplification settings may be automatically applied to test audio. Alternatively or additionally, the test audio with the applied adjusted amplification settings may be automatically output through a speaker of the device. In some embodiments, the test audio may be configured to allow a user of the device to aurally assess the multiple amplification settings.

One skilled in the art will appreciate that, for these processes, operations, and methods, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments.

For example, in some embodiments, the method 400 may further include obtaining a request regarding adjusting settings of audio output by the device. In these and other embodiments, no other audio, which may be configured to allow a user of the device to aurally assess the multiple amplification settings, may be output by the device after obtaining the request and before outputting the test audio with the applied adjusted amplification settings.

In some embodiments, the method 400 may further include, after obtaining the action, determining that interactions with the audio configuration interface have stopped. In these and other embodiments, automatically applying the adjusted amplification settings and automatically outputting the test audio may occur in response to obtaining the action and determining that interactions with the audio configuration interface have stopped. In some embodiments, the method 400 may further include selecting the test audio from multiple test audios based on an obtained indication through the audio configuration interface.

In some embodiments, the method 400 may further include obtaining, while outputting the test audio with the applied adjusted amplification settings, a second action to adjust the amplification of one or more of the multiple amplification settings in the audio configuration interface to generate second adjusted amplification settings. In these and other embodiments, the second adjusted amplification settings may be automatically applied to the test audio.

Figure 5:
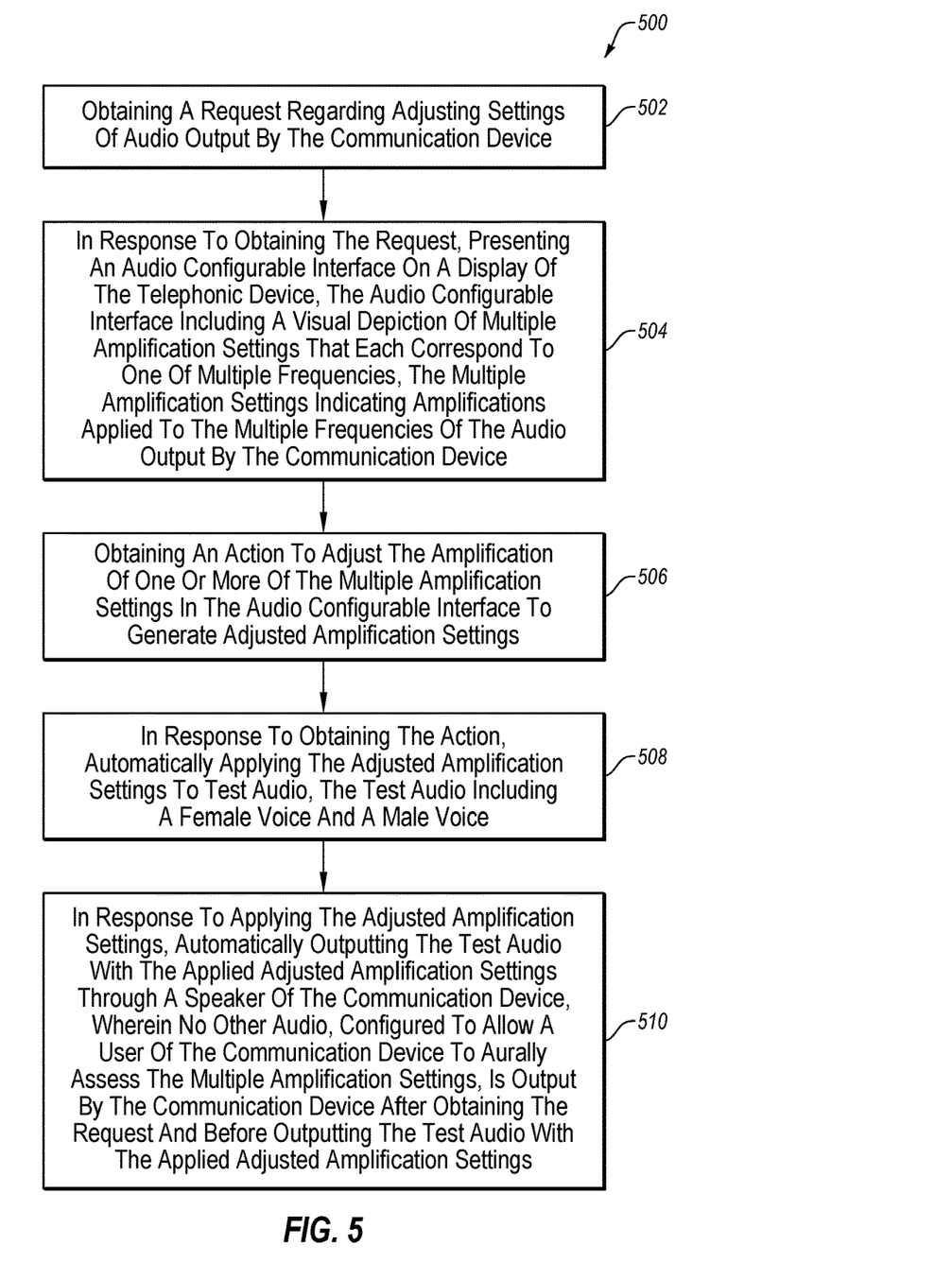
FIG. 5 is a flowchart of another example method to adjust audio amplification.

FIG. 5 is a flowchart of another example method 500 to adjust audio amplification. The method 500 may be arranged in accordance with at least one embodiment described in the present disclosure. The method 500 may be performed, in whole or in part, in some embodiments by a device, such as the communication device 110, the device 200, and/or the communication system 600 of FIGS. 1a, 2, and 6, respectively. In these and other embodiments, some or all of the steps of the method 500 may be performed based on the execution of instructions stored on one or more non-transitory computer-readable media. Although illustrated as discrete blocks, various blocks may be divided into additional blocks, combined into fewer blocks, or eliminated, depending on the desired implementation.

The method 500 may begin at block 502, where a request regarding adjusting settings of audio output by the communication device may be obtained.

In block 504, in response to obtaining the request, an audio configuration interface may be presented on a display of the telephonic device. The audio configuration interface may include a visual depiction of multiple amplification settings that each correspond to one of multiple frequencies. The multiple amplification settings may indicate amplifications applied to the multiple frequencies of the audio output by the communication device.

In block 506, an action to adjust the amplification of one or more of the multiple amplification settings in the audio configuration interface to generate adjusted amplification settings may be obtained.

In block 508, in response to obtaining the action, the adjusted amplification settings may be automatically applied to test audio. The test audio may include a female voice, a male voice, or a female voice and a male voice.

In block 510, in response to applying the adjusted amplification settings, the test audio with the applied adjusted amplification settings may be automatically output through a speaker of the communication device. In these and other embodiments, no other audio, configured to allow a user of the communication device to aurally assess the multiple amplification settings, may be output by the communication device after obtaining the request and before outputting the test audio with the applied adjusted amplification settings.

One skilled in the art will appreciate that, for these processes, operations, and methods, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments.

For example, in some embodiments, the method 500 may further include, after obtaining the action, determining that interactions with the audio configuration interface have stopped. In these and other embodiments, automatically applying the adjusted amplification settings to the test audio may occur in response to obtaining the action and determining that interactions with the audio configuration interface have stopped. In these and other embodiments, determining that interactions with the audio configuration interface have stopped may further include determining a user is no longer touching the display of the communication device. In these and other embodiments, determining that interactions with the audio configuration interface have stopped may further include determining a user is no longer touching the display of the communication device.

In some embodiments, the method 500 may further include selecting the test audio from multiple test audios based on an obtained indication through the audio configuration interface. Alternatively or additionally, the method 500 may further include while outputting the test audio with the applied adjusted amplification settings, obtaining a second action to adjust the amplification of one or more of the multiple amplification settings in the audio configuration interface to generate second adjusted amplification settings and automatically applying the second adjusted amplification settings to the test audio.

Figure 6:
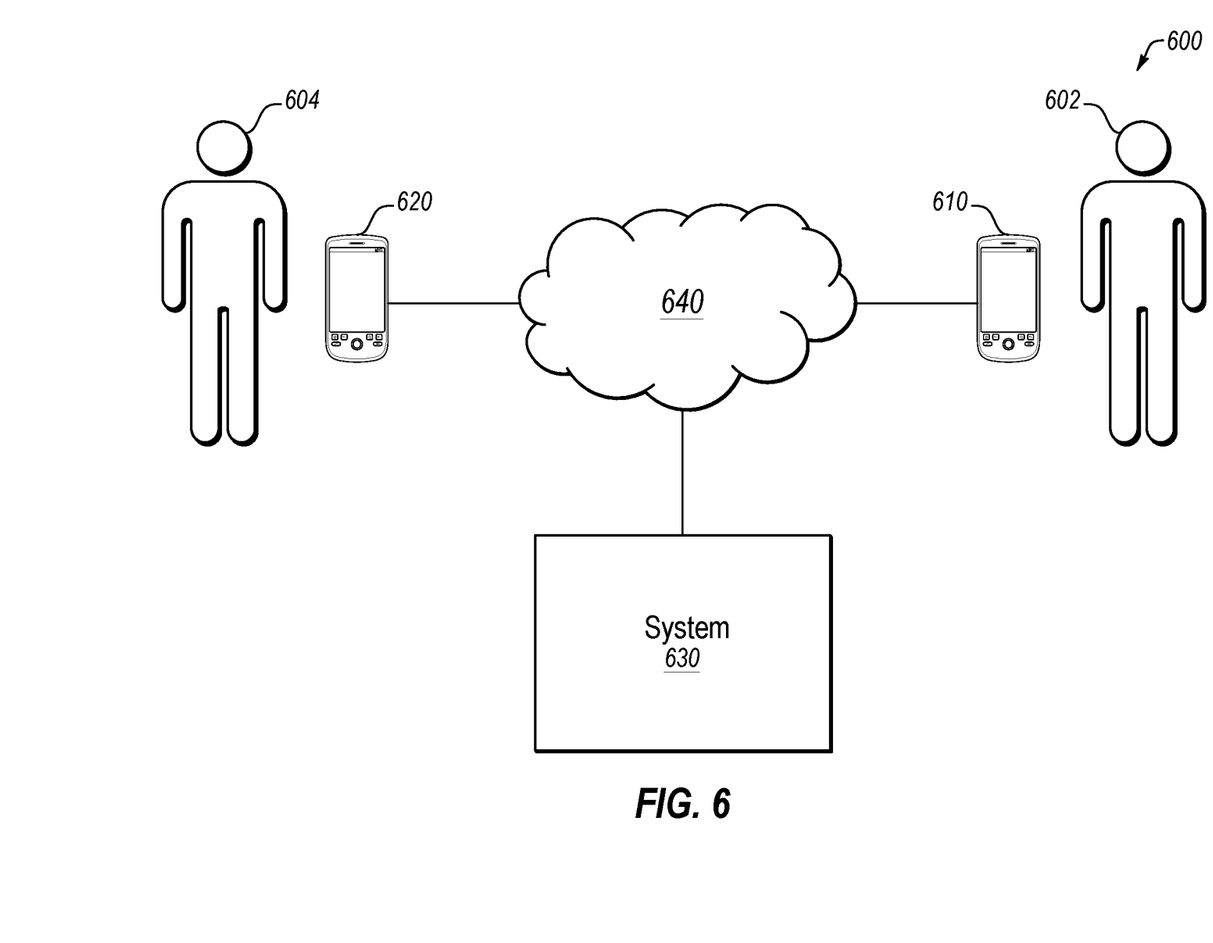
FIG. 6 illustrates an example communication system that may include a communication device configured to adjust amplification of output audio.

FIG. 6 illustrates an example communication system 600 that may include a communication device configured to adjust audio amplification of output audio. The communication system 600 may be arranged in accordance with at least one embodiment described in the present disclosure.

The communication system 600 may include a first device 610, a second device 620, and a system 630. The first device 610 and/or the second device 620 may be examples of the communication device 110 of FIG. 1a. Thus, FIG. 6 illustrates an environment or system that may use the communication device 110 of FIG. 1a.

The first device 610 and the system 630 may be communicatively coupled by a network 640. Alternately or additionally, the first device 610 and the second device 620 may be communicatively coupled by the network 640. In some embodiments, the network 640 may be any network or configuration of networks configured to send and receive communications between systems and devices. In some embodiments, the network 640 may include a conventional type network, a wired or wireless network, and may have numerous different configurations. In some embodiments, the network 640 may also be coupled to or may include portions of a telecommunications network, including telephone lines, for sending data in a variety of different communication protocols, such as a plain old telephone system (POTS).

In some embodiments, the communication system 600 illustrated may be configured to facilitate an assisted call between a hearing-impaired user 602 and a second user 604. As used in the present disclosure, a "hearing-impaired user" may refer to a person with diminished hearing capabilities. Hearing-impaired users often have some level of hearing ability that has usually diminished over a period of time such that the hearing-impaired user can communicate by speaking, but that the hearing-impaired user often struggles in hearing and/or understanding others.

Alternatively or additionally, the communication system 600 illustrated may be configured to facilitate a call between a person with medical expertise and/or experience and the second user 604. As used in the present disclosure, a "person with medical expertise and/or experience" may be a nurse, doctor, or some other trained medical professional.

In some embodiments, a communication session, such as an audio or a video communication session, may be established between the first device 610 and the second device 620. In one example embodiment, the communication session may be a captioning communication session.

In some embodiments, the system 630 may be an assistive service, which is intended to permit a hearing-impaired person to utilize a communication network and assist their understanding of a conversation by providing text captions to supplement voice conversation occurring during communication sessions with other devices, such as the second device 620. Alternatively or additionally, the system 630 may be an assistive service to couple a person with medical expertise and/or experience with a person requesting medical assistance.

During a communication session, the system 630 and the first device 610 may be communicatively coupled using networking protocols. In some embodiments, during the communication session between the first device 610 and the second device 620, the first device 610 may provide the audio signal from the second device 620 to the system 630.

In some embodiments, at the system 630, a call assistant may listen to the audio signal of the second user 604 and "revoice" the words of the second user 604 to a speech recognition computer program tuned to the voice of the call assistant. In these and other embodiments, the call assistant may be an operator who serves as a human intermediary between the hearing-impaired user 602 and the second user 604. In some embodiments, text captions may be generated by the speech recognition computer as a transcription of the audio signal of the second user 604. The text captions may be provided to the first device 610 being used by the hearing-impaired user 602 over the network 640. The first device 610 may display the text captions while the hearing-impaired user 602 carries on a normal conversation with the second user 604. The text captions may allow the hearing-impaired user 602 to supplement the voice signal received from the second device 620 and confirm his or her understanding of the words spoken by the second user 604.

Modifications, additions, or omissions may be made to the communication system 600 without departing from the scope of the present disclosure. For example, in some embodiments, the second user 604 may be hearing impaired. In these and other embodiments, the system 630 may provide text captions to the second device 620 based on audio data transmitted by the first device 610. Alternately or additionally, the system 630 may include additional functionality. For example, the system 630 may edit the text captions or make other alterations to the text captions after presentation of the text captions on the first device 610.

As indicated above, the embodiments described herein may include the use of a special purpose or general purpose computer (e.g., the processor 212 of FIG. 2) including various computer hardware or software modules, as discussed in greater detail below. Further, as indicated above, embodiments described herein may be implemented using computer-readable media (e.g., the computer readable media 220 of FIG. 2) for carrying or having computer-executable instructions or data structures stored thereon.

In some embodiments, the different components, modules, engines, and services described herein may be implemented as objects or processes that execute on a computing system (e.g., as separate threads). While some of the systems and methods described herein are generally described as being implemented in software (stored on and/or executed by general purpose hardware), specific hardware implementations or a combination of software and specific hardware implementations are also possible and contemplated.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A method to adjust audio amplification in a communication device, the method comprising:
    obtaining a request from a user regarding adjusting settings of audio output by the communication device;
    in response to obtaining the request, presenting an audio configuration interface on a display of the communication device, the audio configuration interface including a visual depiction of a plurality of amplification settings that each correspond to a different one of a plurality of frequencies, the plurality of amplification settings indicating amplifications applied to the plurality of frequencies of the audio output by the communication device;
    obtaining an action from the user to adjust the amplification of one or more of the plurality of amplification settings in the audio configuration interface to generate adjusted amplification settings;
    in response to obtaining the action, automatically applying the adjusted amplification settings to test audio, the test audio including a female voice and a male voice;
    in response to applying the adjusted amplification settings, automatically outputting the test audio with the applied adjusted amplification settings through a speaker of the communication device;
    while outputting the test audio with the applied adjusted amplification settings, obtaining a second action from the user to adjust the amplification of one or more of the plurality of amplification settings in the audio configuration interface to generate second adjusted amplification settings;
    automatically applying the second adjusted amplification settings to the test audio; and
    in response to automatically applying the second adjusted amplification settings to the test audio, un-applying the adjusted amplification settings to the test audio.

2. The method of claim 1, wherein the speaker is a first speaker, the method further comprising associating the adjusted amplification settings with the first speaker such that the adjusted amplification settings are applied to audio output by the first speaker but are not applied to audio output by a second speaker of the communication device.

3. The method of claim 2, wherein when outputting the test audio with the applied adjusted amplification settings through the speaker, no audio is output by the second speaker.

4. The method of claim 1, wherein determining that interactions with the audio configuration interface have stopped further includes determining the user is no longer touching the display of the communication device.

5. The method of claim 1, further comprising selecting the test audio from a plurality of test audios based on an obtained indication through the audio configuration interface.

6. At least one non-transitory computer-readable media configured to store one or more instructions that in response to being executed by at least one computing system cause performance of the method of claim 1.

7. The method of claim 1, further comprising in response to obtaining the action, determining that interactions with the audio configuration interface have stopped, wherein automatically applying the adjusted amplification settings and automatically outputting the test audio occur in response to obtaining the action and determining that interactions with the audio configuration interface have stopped.

8. A method to adjust audio amplification, the method comprising:

presenting an audio configuration interface, the audio configuration interface including a plurality of amplification settings that each correspond to a different one of a plurality of frequencies, the plurality of amplification settings indicating amplifications applied to the plurality of frequencies of audio output by a device;

obtaining an action from a user to adjust the amplification of one or more of the plurality of amplification settings in the audio configuration interface to generate adjusted amplification settings; and in response to obtaining the action,
- automatically applying the adjusted amplification settings to test audio;
- automatically outputting the test audio with the applied adjusted amplification settings through a speaker of the device;
- while outputting the test audio with the applied adjusted amplification settings, obtaining a second action from the user to adjust the amplification of one or more of the plurality of amplification settings in the audio configuration interface to generate second adjusted amplification settings;
- automatically applying the second adjusted amplification settings to the test audio; and
- in response to automatically applying the second adjusted amplification settings to the test audio, un-applying the adjusted amplification settings to the test audio.

9. The method of claim 8, wherein the test audio is configured to allow the user of the device to aurally assess the plurality of amplification settings.

10. The method of claim 8, further comprising after obtaining the action, determining that interactions with the audio configuration interface have stopped, wherein automatically applying the adjusted amplification settings and automatically outputting the test audio occur in response to obtaining the action and determining that interactions with the audio configuration interface have stopped.

11. The method of claim 8, further comprising selecting the test audio from a plurality of test audios based on an obtained indication through the audio configuration interface.

12. At least one non-transitory computer-readable media configured to store one or more instructions that in response to being executed by at least one computing system cause performance of the method of claim 8.

13. The method of claim 8, further comprising associating the adjusted amplification settings with the speaker such that the adjusted amplification settings are applied to audio output by the speaker but are not applied to audio output by a second speaker of the device, wherein when outputting the test audio with the applied adjusted amplification settings through the speaker of the device, no audio is output by the second speaker.

14. A communication device configured to adjust audio amplification, the communication device comprising:
- a display configured to present an audio configuration interface, the audio configuration interface including a plurality of amplification settings that each correspond to a different one of a plurality of frequencies, the plurality of amplification settings indicating amplifications applied to the plurality of frequencies of audio output by the communication device;
- a speaker configured to output test audio with adjusted amplification settings applied thereto;
- a computing system communicatively coupled to the display and the speaker; and
- at least one non-transitory computer-readable media coupled to the computing system, the at least one non-transitory computer-readable media configured to store one or more instructions that in response to being executed by the computing system cause performance of operations including:
  - provide the audio configuration interface to the display;
  - obtain an action from a user to adjust the amplification of one or more of the plurality of amplification settings in the audio configuration interface to generate the adjusted amplification settings; and
  - in response to obtaining the action,
    - automatically apply the adjusted amplification settings to test audio;
    - automatically provide the test audio with the applied adjusted amplification settings to the speaker;
    - while the speaker is outputting the test audio with the applied adjusted amplification settings, obtain a second action from the user to adjust the amplification of one or more of the plurality of amplification settings in the audio configuration interface to generate second adjusted amplification settings;
    - automatically apply the second adjusted amplification settings to the test audio; and
    - in response to automatically applying the second adjusted amplification settings to the test audio, un-apply the adjusted amplification settings to the test audio.

15. The communication device of claim 14, wherein the test audio is configured to allow the user of the communication device to aurally assess the plurality of amplification settings.

16. The communication device of claim 14, wherein the operations further include after obtaining the action, determining that interactions with the audio configuration interface have stopped, wherein automatically applying the adjusted amplification settings and automatically providing the test audio to the first speaker occur in response to obtaining the action and determining that interactions with the audio configuration interface have stopped.

17. The communication device of claim 16, wherein the operations further include after obtaining the action, determining a threshold period of time has occurred since obtaining the action, wherein automatically providing the test audio to the speaker occurs in response to obtaining the action, determining that interactions with the audio configuration interface have stopped, and determining the threshold period of time has occurred.

* * * * *